United States Patent
Busch

(10) Patent No.: US 6,876,184 B2
(45) Date of Patent: Apr. 5, 2005

(54) CIRCUIT ARRANGEMENT FOR MEASURING THE CURRENT CONSUMPTION OF A TRANSISTOR-CONTROLLED LOAD

(75) Inventor: Peter Busch, Augsburg (DE)

(73) Assignee: Fujitsu Siemens Computers GmbH, Munich (DE)

( * ) Notice: Subject to any disclaimer, the term of this patent is extended or adjusted under 35 U.S.C. 154(b) by 23 days.

(21) Appl. No.: 10/204,420

(22) PCT Filed: Mar. 30, 2001

(86) PCT No.: PCT/DE01/01211
§ 371 (c)(1),
(2), (4) Date: Nov. 7, 2002

(87) PCT Pub. No.: WO01/79864
PCT Pub. Date: Oct. 25, 2001

(65) Prior Publication Data
US 2003/0106794 A1 Jun. 12, 2003

(30) Foreign Application Priority Data
Apr. 18, 2000 (DE) .......................... 100 19 240

(51) Int. Cl.$^7$ ............................ G01R 19/00; H02P 7/288
(52) U.S. Cl. ................................ 324/76.11; 324/158.1; 388/833; 318/254
(58) Field of Search ................... 324/76.11, 139, 324/145, 158.1; 388/800, 824–825, 832–833, 902, 907.5; 318/254, 439

(56) References Cited

U.S. PATENT DOCUMENTS

| 4,008,426 A | * | 2/1977 | Ogura ........................ 388/824 |
| 5,828,308 A | | 10/1998 | Fukami |
| 5,867,014 A | | 2/1999 | Wrathall et al. |
| 6,041,163 A | * | 3/2000 | Cherry, Jr. .................. 388/811 |

FOREIGN PATENT DOCUMENTS

| DE | 4101492 C2 | 7/1993 |
| DE | 19520735 C2 | 7/1999 |
| DE | 19844465 A1 | 4/2000 |
| EP | 0688077 B1 | 12/1995 |
| FR | 2642176 A1 | 7/1990 |
| JP | 07077546 | 3/1995 |

* cited by examiner

*Primary Examiner*—Minh N. Tang
(74) *Attorney, Agent, or Firm*—Cohen, Pontani, Lieberman & Pavane

(57) ABSTRACT

The invention relates to a circuit arrangement for measuring the current consumption of a transistor-controlled load, in particular of an electromotor, whereby a load current ($I_L$) is detected by measuring the controlling current ($I_{T2}$) of an output bipolar transistor (T1). The controlling current ($I_{T2}$) is detected using the voltage drop across an internal measuring shunt ($R_1$). As the controlling current ($I_{T2}$) is substantially smaller than the load current, the power losses are negligible in comparison with a measuring shunt that is connected in series to the load. In addition, there is no need for a controlling unit input, to which an external measuring-circuit voltage is applied.

6 Claims, 1 Drawing Sheet

CIRCUIT ARRANGEMENT FOR MEASURING THE CURRENT CONSUMPTION OF A TRANSISTOR-CONTROLLED LOAD

RELATED APPLICATIONS

This is a U.S. National Stage of International Application No. PCT/DE01/01211 filed 30 Mar. 2001.

This patent application claims priority of German patent application no. 100 19 240.8 filed 18 Apr. 2000, the disclosure of which is hereby incorporated by reference.

FIELD OF THE INVENTION

The invention pertains to a circuit array for measuring the current consumption of a transistor-controlled load, in particular of an electric motor.

BACKGROUND OF THE INVENTION

It is the purpose of such circuit arrays to detect the current in a load circuit, in order to allow the load to be controlled. The current is usually measured by a precision resistor senate relative to the load, so that a measuring voltage proportional to the current in accordance with the relation U=R * I can be tapped over the resistor. It is a problem of such an array that, in the precision resistor, a relatively great output is converted into heat because the precision resistor must not be too small for a sufficiently high measuring voltage to be obtained for evaluation. Especially when large currents are present in the load circuit, this problem attains greater significance, as the power dissipation rises quadratically with respect to the load.

BRIEF SUMMARY OF THE INVENTION

One object of the invention is to provide a circuit array in which the power dissipation caused by measuring the load current is very small, but wherein the design of the circuit array is nevertheless simple.

This and other objects are attained in accordance with one aspect of the invention directed to a circuit array for measuring a current consumption of a transistor-controlled load, in particular of an electric motor. One Output Bipolar Transistor is arrayed as a voltage follower. A Controlling Unit is provided for activating the base of the Output Bipolar Transistor, including (a) a Precision Resistor located in a branch parallel to a base-collector segment of the Output Bipolar Transistor, and (b) a measuring device which detects a voltage drop over the Precision Resistor. The load is an electronically commuted electric motor, and the measuring device comprises an Evaluative Device which evaluates impulses found in the voltage drop over the Precision Resistor for the purpose of determining the number of revolutions of the electric motor.

The circuit array in one embodiment of the invention takes advantage of the fact that, when a transistor is switched as a voltage follower, the control current at the base is proportional to the emitter collector current, i.e. the load current. The control current and the load current are coupled via the forward amplification, so called, of the output transistor, which is nearly constant over a wide area. A first great advantage arises from the fact that the power dissipation converted in the precision resistor is lower by a factor of 10 to 50 than in an array in keeping with the state of the art. The resistor may therefore safely be integrated into a controlling unit which, for example, is embodied as an integrated circuit. Another advantage arises from the fact that it permits the realization of a component containing the controlling unit with one less pin, as the pin to which the measuring voltage is otherwise fed is rendered superfluous.

In an advantageous embodiment of the invention, an evaluative device connected to the device which indicates the current evaluates impulses present in the controlling current of the output transistor. This is of advantage because, as a rule, the forward current amplification is not precisely known. During evaluation of impulses, in which the time of their occurrence is frequently the only factor of interest, the absolute value of the voltage or the current is of no importance.

DETAILED DESCRIPTION OF THE DRAWINGS

Figure 1:
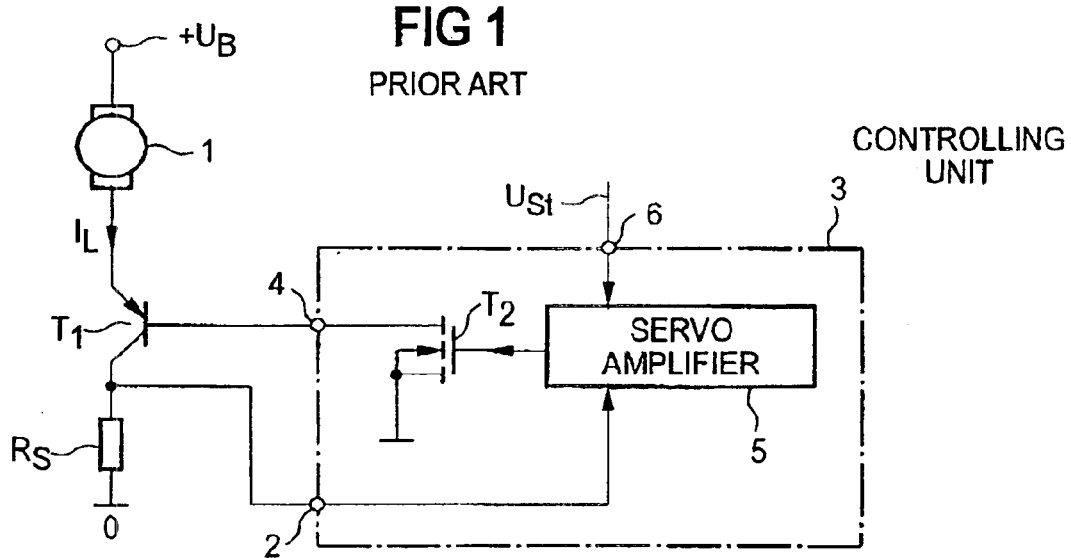
FIG. 1 shows a circuit array in accordance with the state of the art.

FIG. 1 shows a circuit array in accordance with the state of the art, used for driving a Ventilated Motor 1. The Ventilator 1, an Output Transistor T1 and a Precision Resistor $R_S$ are switched in series between an Operating Voltage Source $U_B$ and the Reference Potential 0. Thus, Precision Resistor $R_S$ is arrayed between Transistor T1 and Reference Potential 0. The voltage over Precision Resistor $R_S$ is tapped and fed to a Measuring Port 2 of a Controlling Unit 3. Transistor T1 is arrayed as a voltage follower. As a result, voltage amplification is approximately 1 and current amplification typically ranges between a factor of 10 and 50. The base of Output Transistor T1 is connected to a Controlling Output Port 4 of Controlling Unit 3. The design of Controlling Unit 3 essentially comprises a Controlling Transistor T2 which controls the base current of Output Transistor T1, and a Servo Amplifier 5, which controls Controlling Transistor T2 on the basis of the voltage value fed to Measuring Port 2. An additional Operating Voltage $U_{st}$ may be fed to a Controlling Input 6, presetting a desired value for driving Ventilated Motor 1.

Since Load Current $I_L$ is relatively high, current dissipation in Precision Resistor $R_S$ is likewise relatively high, so that the latter cannot be incorporated in an integrated circuit containing Controlling Device 3, due to the heat being generated.

Figure 2:
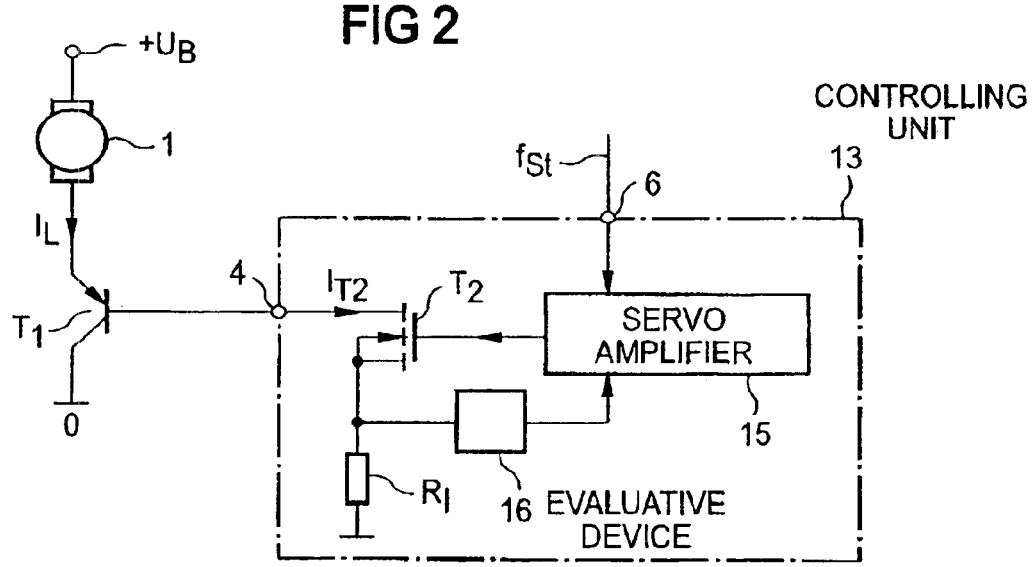
FIG. 2 shows a circuit array in accordance with the invention.

A circuit array in accordance with the invention is illustrated in FIG. 2. The intended purpose of the circuit array is the same as in the state of the art illustrated in FIG. 1, i.e. the circuit array is used for controlling a Ventilated Motor 1. Output Transistor T1 does not differ from the one shown in FIG. 1. However, the collector of Transistor T1 is not connected to Reference Potential 0 via a precision resistor but directly fed to Reference Potential 0. As in the state of the art, the base of Output Transistor T1 is connected to a Controlling Output Port 4 of a Controlling unit 13. In order to determine Load Current $I_L$, the circuit array of the invention evaluates the Controlling Current $I_{T2}$ of Transistor T1. For this purpose, a Precision Resistor $R_I$ is arrayed in the input path. Voltage over Resistor $R_I$ is now indicative of the quantity of Controlling Current $I_{T2}$. If forward amplification $h_{FE}$ of Output Transistor T1 is known, Load Current $I_L$ may be computed by multiplying Controlling Current $I_{T2}$ with forward amplification $h_{FE}$. In the instant case, however, it is not so much the absolute value of the load current that is of interest as rather the times of commutation. It is therefore sufficient for a current to flow through Precision Resistor $R_I$ which is proportional to the load current. It may be assumed that minimum forward amplification amounts to approximately 10. Output dissipation in Precision Resistor $R_I$ is computed $P_{tot}=I_{T2}^2*R_I$. As a result, current dissipation in Precision Resistor $R_I$ is significantly less than in Precision Resistor $R_S$ in accordance with the state of the art.

Voltage over Resistor $R_I$ is tapped and fed to an Evaluative Device 16, since it is the frequency of the commutation impulses which is to be evaluated. The differentiator is connected to a Servo Amplifier 15, which thus receives a signal with pulses appropriate to the frequency of the commutation impulses.

Servo Amplifier 15 in turn controls Controlling Transistor T2. At one Control Input 6 of Servo Amplifier 15, a Desired Frequency $f_{st}$ is provided, by which a desired frequency is preset for controlling Ventilated Motor 1.

Desired Frequency $f_{st}$ is compared with the measured frequency made available by Evaluative Device 16, and Output Transistor T1 is controlled on the basis of the comparison. Instead of a Desired Frequency $f_{st}$, a desired voltage may be provided, with which a voltage-controlled oscillator is then activated, allowing a desired frequency to be set in turn.

Due to the low power dissipation in Resistor $R_I$, the latter may be integrated in Controlling Unit 13. An additional input serving to feed a measuring voltage is thus rendered superfluous. Saving one pin for a measurement input may markedly reduce the cost of manufacturing the controlling device.

In another embodiment, an npn transistor is used as output transistor. Appropriately, the polarities of distribution voltage are reversed in such an embodiment. The variant described above, with a pnp transistor has the advantage that Ventilator 1 can be driven with 12 V, whereas the controlling circuit is supplied with 5 V. When the polarities are reversed and an npn transistor is used, this ceases to be possible.

For the pnp transistor variant, the controlling transistor is an n-channel-FET, whereas a p-channel-FET would have to be used in the case of an npn transistor. However, N-channel-FETs are generally preferred because of their greater charge carrier mobility.

What is claimed is:

1. Circuit array for measuring a current consumption of a transistor-controlled load, in particular of an electric motor, comprising:
   one Output Bipolar Transistor (T1) arrayed as a voltage follower,
   a Controlling Unit (13) for activating the base of said Output Bipolar Transistor (T1), including
     (a) a Precision Resistor (RI) located in a branch parallel to a base-collector segment of said Output Bipolar Transistor (T1), and
     (b) a measuring device which detects a voltage drop over said Precision Resistor (RI);
   wherein the load is an electronically commuted electric motor and said measuring device comprises an Evaluative Device (16) which evaluates impulses found in said voltage drop over said Precision Resistor (RI) for the purpose of determining the number of revolutions of said electric motor.

2. Circuit array in accordance with claim 1, wherein
said Output Bipolar Transistor (T1) is a pnp transistor whose collector is connected to a Reference Potential (0) and whose emitter is connected to one terminal of the load, with another terminal of the load being connected to a Supply Potential (+UB).

3. Circuit array in accordance with claim 1, wherein
said Precision Resistor (RI), and said Evaluative Device (16) are part of said Controlling Unit (13) and are arrayed in a joint component case.

4. Circuit array in accordance with claim 1, wherein
a Controlling Transistor (T2) is arrayed between a first terminal of said Precision Resistor (RI) and said Output Bipolar Transistor (T1), with a Controlling Transistor (T2) constituting part of said Controlling Unit (13), and that a second terminal of said Precision Resistor (RI) is connected to a collector of said Output Bipolar Transistor (T1).

5. Circuit array in accordance with claim 4, wherein
said Controlling Transistor (T2) is a field effect transistor.

6. Circuit array in accordance with claim 4, wherein
a Servo Amplifier (15) is arrayed between the first terminal of said Precision Resistor (RI) and a control terminal of said Controlling Transistor (T2), said Servo Amplifier (15) activating the Controlling Transistor (T1) based on the frequency of the impulses found in the voltage drop over said Precision Resistor.

* * * * *